SWITCHING CIRCUITS USING SOLID STATE SWITCHES
Filed April 7, 1965
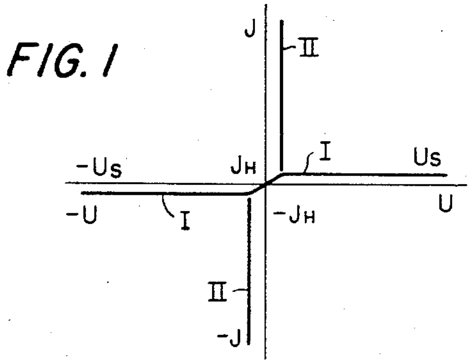
FIG. 3
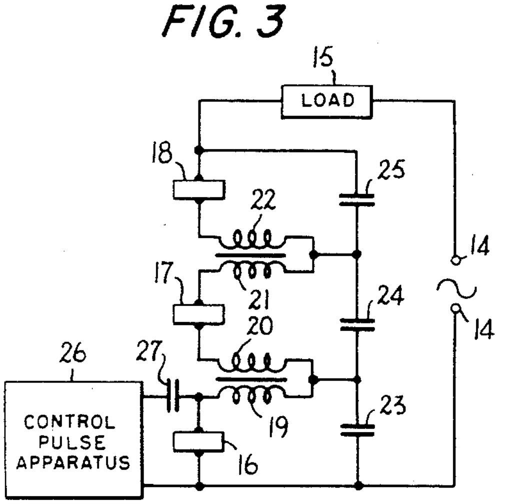
FIG. 2
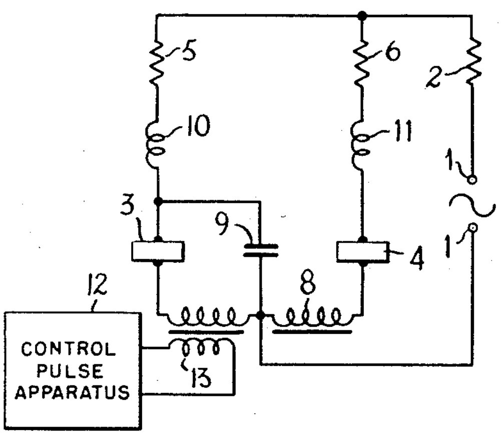
FIG. 4
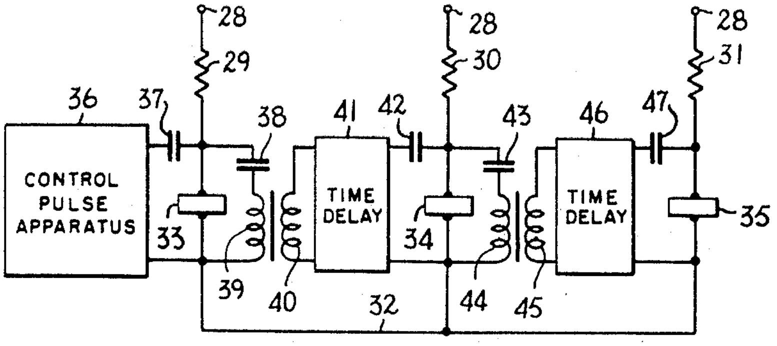

United States Patent Office 3,423,605
Patented Jan. 21, 1969

3,423,605

SWITCHING CIRCUITS USING SOLID STATE SWITCHES

Arne Jensen, Als, Denmark, assignor to Danfoss A/S, Nordborg, Denmark, a company of Denmark Filed Apr. 7, 1965, Ser. No. 446,799
Claims priority, application Germany, Mar. 19, 1964, D 43,928
U.S. Cl. 307—300 9 Claims
Int. Cl. H03k 3/26, 19/08, 23/08

The invention relates to an electrically controlled switch for an electric circuit, and more particularly to a switch utilizing several solid state switching elements, which when a threshold value of an applied voltage or electrical field thereacross is exceeded, switch from the high resistance condition to the low resistance condition.

Often, several solid state switch elements must be used, e.g. in multiphase circuits; or to obtain greater current carrying capacity, shunt connections; or in order to obtain high insulation resistances, in series connections. In such cases it is often a problem to switch all of the solid state switch elements effectively.

A small difference, or unsymmetry between elements may be enough to cause one switch to react before another one; the voltage across the first switch element, which changes to its low resistance state, drops low, and a parallel connected switch element then will not obtain a sufficiently large voltage to switch cover.

In series connection of several solid state switch elements it is often impossible to use a control pulse which exceeds the sum of the threshold voltages of all solid state switches. In the case of multiphase or shunt connections it may be difficult to reach all solid state switches by means of one control pulse.

It is an object of the present invention to overcome the aforementioned problems.

Briefly, in accordance with the invention, at least one switch element unit is arranged to form a series connection with the primary winding of a transformer, the secondary winding of which is placed in the control circuit of another solid state switch element.

A slave or a cascade connection is established, by means of which the operation of one solid state switch element causes the next switch to function; this chain reaction might be repeated as often as wanted. When one switch element out of two or more solid state elements, which have no priority in relation to each other, switches over, then the next element must follow. The elements might also be arranged one after another, in series, controlled by a control pulse applied to the first switch element only.

In many cases the current pulse due to the switching of the first activated solid state switch element is sufficient to provide an adequate control voltage in the control circuit of the second or next solid state switching element. It may often be desirable to discharge a capacitor which has been charged from the current supply circuit over the first mentioned solid state switch of the transformer and the primary winding. Thus a defined pulse is obtained independent of the load resistance from the current circuit, and determined in respect to amplitude and duration of time, to actuate the second solid state switch element.

In one embodiment of the invention the solid state switch elements are connected in parallel, and the voltage from the secondary winding of the transformer is superimposed on the voltage of the circuit. In particular the primary and the secondary winding may form parts of an auto-transformer, which again is connected to a transfer winding of a control apparatus.

In another embodiment the solid state switch elements form a series connection, and their threshold value is exceeded by the voltage created in the secondary winding.

A third embodiment is shown in form of a multiphase switch wherein each phase is provided with a solid state switch element and a time delay is inserted in each of the transformer transmission circuits.

A particularly interesting device for use in connection with solid state switch elements useful in the invention is made from a polycrystalline base substance of tellurium, with additives taken from Group IV and V of the Periodic Table of Elements. As an example, a solid state switch may consist of approximately 67.5% tellurium, 25% arsenic, and 7.5% germanium, made by vapor deposition or evaporation on a metal plate, by sintering, or by solidification of an alloy melt. The resulting switch elements are absolutely symmetrical, have high current carrying capacity, and are easily manufactured. Their switching threshold potential can readily be changed by choice of the relative ratio of components, or by appropriate choice of the thickness of the body. A pair, or more of such solid state switch elements can be arranged as a single unit on a common substate, which may form an electrode. Each of the elements can be switched separately; yet a combined assembly is entirely possible, simplifying the connection to the common terminal or junction over that of several physically separate parts or elements.

The invention is also applicable for use with other solid state switch elements, such as monocrystalline multilayer diodes, for example five layer diodes.

The structure, organization and operation of the invention will now be described more specifically in the following detailed description with reference to the accompanying drawings, in which:

FIG. 1 is a typical voltage (abscissa) vs. current (ordinate) diagram for a solid state switching element for use in the switch according to the present invention;

FIG. 2 is an embodiment of a switch according to the present invention;

FIG. 3 is another embodiment of a switch according to the present invention; and FIG. 4 is another embodiment of a switch according to the present invention.

FIG. 1 shows, diagrammatically, a current J through a symmetrical solid state switching element, having a voltage U applied thereacross. Below the threshold potential $\pm U_S$, the current is practically zero since the element is in its high resistance state, in which its resistance is up to several megohms (Curve I). As soon as the switching threshold potential $U_S$ is exceeded, the switching element changes to its low resistance state (Curve II), in which its resistance may be one ohm or less. The current through the switch is then essentially determined only by the resistance of the remainder of the circuit. The element remains in the low resistance state until the current therethrough decreases below the holding value $J_H$, which is almost at the zero point. As soon as $J_H$ is passed, the element changes back to its high resistance state.

The circuit of FIG. 2 consists of an alternating current supply 1, a load which is illustrated in the form of a resistor 2, and a switch to connect the load. The switch comprises a pair of solid state switch elements 3 and 4 in each of two parallel connected lines and resistors 5 and 6. Furthermore each of the two lines contains a winding 7 and 8 of an autotransformer. The solid state switch 3 and the winding 7 are shunted by means of a capacitor 9 charged by the AC supply 1 while the switch elements 1, 2 are in their high resistance state and are thus in what in effect is an "open" condition. Both parallel lines are provided with choke coils 10, 11, which protect the two solid state switches 3 and 4 against interference or surge voltages from the supply mains 1. The switches are actuated by means of a control apparatus 12 via a transformer winding 13, which is coupled to the autotransformer.

The switch elements 3, 4 are arranged in such a way that their threshold values are above the voltage from the mains 1. Only on an increase of the voltage by means of an extra voltage in the windings 7, 8, respectively, will the switches be able to switch over to the low resistance condition and thus act as if these switches were "closed" or "ON" it being undestood that, of course, the switch elements are actually always in circuit. It is to be assumed that when the control apparatus 12 gives an impulse, then the switch 3 will be the first one to switch over, either because the winding 7 has a higher number of turns than the winding 8, or because the threshold voltage of switch element 3 is lower than the threshold voltage of switch element 4. When the switch element 3 has changed to its low resistance condition the capacitor 9 discharges through the switch 3 and the winding 7. The latter then acts as a primary winding, and produces in the secondary winding 8 a corresponding voltage pulse. This pulse can, by suitable design of the individual elements, be arranged to be of such value that a voltage is applied across solid state switch element 4 which exceeds the threshold value thereof, causing it to switch over to the low resistance condition as well. The relative loading of the two parallel branches can be arranged by suitably adjusting the resistors 5 and 6; resistor 5 may, for instance be large compared with the resistor 6, so that solid state switch 3 in fact only constitutes a means to initiate, or aid in the actuation of the solid state switch element 4. This may, for instance be necessary if the solid state switch 4, in its low resistance condition, is designed to have extremely low resistance and high current carrying capacity, but on the other hand requires a considerably higher threshold value to switch its state.

Referring now to FIG. 3, a load resistance 15 is connected to an AC current supply 14; three solid state switches 16, 17 and 18 are series connected with load 15 to switch it ON. Series connection may be necessary if the load resistance is to be protected by a high insulation resistance. Primary winding 19 and the secondary winding 20 of a transformer, as well as the primary winding 21 and the secondary winding 22 of another transformer are in series connection with the three solid state switches. One capacitor 23 shunts the switch 16 and the primary winding 19, another capacitor 24 shunts the secondary winding 20, the switch 17 and the primary winding 21, and a third capacitor 25 shunts the secondary winding 22 and the switch 18. The switch 16 is coupled over an isolating capacitor 27 to a control pulse source 26.

The capacitors 23–25 are charged from the supply mains 14, the voltage of which is lower than the threshold value $U_S$ of each of the three solid state switches 16–18. During the charging of the capacitors the solid state switches are in their high ohmic condition or state and are in effect "open" or "OFF." If a control pulse from apparatus 26 brings the switch 16 into its low resistance condition, in which the switch is in effect "closed," then the capacitor 23 will be discharged over this switch and the primary winding 19. A pulse is therefore, induced in the winding 20 which adds to the voltage over the capacitor 24, whereby the threshold value of the switch 17 is exceeded, and the switch element 17 changes over to the low resistance condition or "closes." Now the capacitor 24 is discharged over the secondary winding 20, the switch 17 and the primary winding 21, whereby another voltage pulse is induced in the secondary winding 22. This voltage pulse is superimposed on the voltage from the capacitor 25 which causes the switch 18 to change over to the low resistance condition as well. Now all three switches have a low resistance, and a load current flows through the resistor 15.

In the FIGS. 2 and 3 it is assumed that an AC voltage is supplied from the supply mains 1, 14. That means that the solid state switches will return to their high resistance condition after each half-period if the above mentioned type is used. If a permanently ON switch is wanted, then the control pulse sources 12, 26 must apply a control pulse each half cycle. This problem can be solved in various ways, among others by means of a sine voltage which is phase displaced in relation to the AC voltage from the main supply. One could, however, use also square waves, single pulses, or the like, as a control voltage. Most advantageously the control apparatus is somehow connected to the mains in such a way that a predetermined phase relationship is retained. The same system may also be used for control of DC loads if a separate OFF switch, not shown, is provided.

FIG. 4 illustrates an application for use in a three phase system. Three phase resistors 29, 30 and 31 are connected to a three phase mains supply 28. A solid state switch 33, 34 and 35 is provided in each phase between the load and the star point 32. These switches are assumed to be in their high ohmic condition. A control pulse source apparatus 36 connects, over isolating capacitor 37, a control pulse to the solid state switch 33, which then changes over to the low resistance condition. At this moment a capacitor 38, which has already been charged by the phase voltage while the switch elements are in their high resistance state, discharges over the solid state switch 33 and the primary winding 39 of a transformer, in the secondary winding 40 of which a voltage pulse is induced. A time delay element or circuit 41, of any well known design and another isolating capacitor 42 applies this voltage pulse to the solid state switch 34 in the second phase, which then switches over to its low resistance condition. This sequence is repeated so that on a discharging of a capacitor 43, heretofore charged from the supply mains 28 while the switch elements are in their high resistance state and thus "OFF" or "open," a voltage pulse causing a switching function is applied to the solid state switch 35 in the third phase; this voltage pulse is applied over the primary winding 44 to the secondary winding 45 of another transformer, a time delay circuit 46, and an isolating capacitor 47.

The time delays 41 and 46 are of such a nature that each of them causes a phase displacement of about 60 electric degrees. A control pulse from the apparatus 36 is therefore applied to each phase voltage at the proper time. Shortly after the switching ON of the switch 35 the switch 33 returns to its high resistance condition, as the half period for the first phase is over. Shortly afterwards the control pulse source 36 supplies a new impulse to permit current flow in the opposite direction. The whole sequence is repeated in the second half cycle of all three phases.

Various modifications of the illustrated embodiments of the invention may be made without departing from the basic idea of the invention. For instance, the capacitor 9 in FIG. 2 may be connected with both lines; it will there be quite unimportant which of the two switch elements 3 and 4 changes over first to the low-resistance condition; the other switch element will under all circumstances be forced into the conducting condition.

What is claimed is:

1. A switching circuit comprising, a semiconductor switch device comprising a plurality of solid state nonrectifying switch elements each capable of passing both cycles of alternating current and capable of being switched from a normally high impedance to a low impedance state, inductive means connected in circuit with said semiconductor device, means to couple a control signal voltage to said inductive means effective to apply a single signal to switch one of said non-rectifying switch elements to a low impedance state, an alternating voltage source, capacitive means charged from said source and connected to said inductive means and to said one of said non-rectifying switch elements and cooperative therewith to produce a triggering voltage across at least another of said plurality of non-rectifying switch elements sufficient to switch same to the low impedance state in response to the presence of said single control signal voltage and the switching of said one switch to a low impedance state.

2. A switching circuit comprising, a plurality of solid state non-rectifying switch elements each capable of passing both cycles of alternating current and capable of being switched from a normally high impedance to a low impedance state, means to switch said non-rectifying switch elements in a serial mode to a low impedance state comprising, inductive means connected in circuit with said non-rectifying switch elements and in series with a first one of said non-rectifying switch elements, means to apply a single control voltage signal to said inductive means effective to switch said first one of said non-rectifying switch elements to a low impedance state, an alternating voltage source, capacitive means charged from said source and connected with said inductive means and to respective switch elements and responsive to the switching of said first one of said non-rectifying switch elements to produce triggering signals effective to switch in a serial mode the remaining switch elements of said plurality to the low impedance state thereof, and means connecting said source independent of said means to apply said signal voltage to said inductive means to charge said capacitive means.

3. A switching circuit according to claim 2, in which capacitive means comprise a plurality of capacitors and including connections for discharging said capacitors in a serial mode through said non-rectifying switch elements and through said inductive means in response to said single voltage signal thereby applying said triggering signals.

4. A switching circuit according to claim 3, in which said inductive means comprises transformer windings in series with said non-rectifying switch elements comprising secondary windings to supply the triggering signals to said remaining non-rectifying switch elements.

5. A switch circuit according to claim 4, in which said non-rectifying switch elements are connected in series.

6. A switching circuit according to claim 2, in which said inductive means comprises an autotransformer in series with each of said solid state non-rectifying switch elements.

7. A switching circuit according to claim 2, including delay means connected to said inductive means providing selected phasing of said triggering signals relative to phases of a multiphase circuit to which said switching circuit is connected.

8. A switching circuit according to claim 2, in which said means to apply said control signal voltages comprises a pulse generator, and in which said capacitive means comprises at least one capacitor discharged in operation to produce said triggering signals.

9. A switching circuit according to claim 2, in which said solid state non-rectifying switch elements are connected in series, and in which said inductive means comprise at least one transformer in series with said non-rectifying switch elements and having a secondary winding, the threshold value of at least the non-rectifying switch elements other than said one non-rectifying switch element being exceeded by a voltage induced in said secondary winding.

References Cited

UNITED STATES PATENTS

| | | | |
|---|---|---|---|
| 3,154,695 | 10/1964 | MacGregor et al. | 307—88.5 |
| 3,188,487 | 6/1965 | Hutson | 307—88.5 |
| 3,189,747 | 6/1965 | Hoff | 307—88.5 |
| 3,271,591 | 9/1966 | Ovshinsky. | |
| 2,088,474 | 7/1937 | Haller | 328—210 |
| 3,226,625 | 12/1965 | Diebold | 307—88.5 X |
| 2,985,770 | 5/1961 | Kneisel | 307—88.5 |
| 3,158,799 | 11/1964 | Kelly et al. | 307—88.5 |

ARTHUR GAUSS, *Primary Examiner.*

B. P. DAVIS, *Assistant Examiner.*

U.S. Cl. X.R.

307—293; 317—235